(12) United States Patent
Khatavkar et al.

(10) Patent No.: US 12,316,341 B2
(45) Date of Patent: May 27, 2025

(54) CROSS-COUPLED CAPACITIVE ELEMENTS IN HIGHSPEED DAC

(71) Applicant: XILINX, INC., San Jose, CA (US)

(72) Inventors: Prathamesh Mukund Khatavkar, Dublin (IE); Roberto Pelliconi, Imola (IT)

(73) Assignee: XILINX, INC., San Jose, CA (US)

( * ) Notice: Subject to any disclaimer, the term of this patent is extended or adjusted under 35 U.S.C. 154(b) by 259 days.

(21) Appl. No.: 18/133,812

(22) Filed: Apr. 12, 2023

(65) Prior Publication Data

US 2024/0348261 A1    Oct. 17, 2024

(51) Int. Cl.
*H03M 1/80* (2006.01)
*H03M 1/06* (2006.01)
*H03M 1/68* (2006.01)
*H03M 1/74* (2006.01)
*H03M 1/78* (2006.01)

(52) U.S. Cl.
CPC ......... *H03M 1/802* (2013.01); *H03M 1/0624* (2013.01); *H03M 1/68* (2013.01); *H03M 1/747* (2013.01); *H03M 1/785* (2013.01)

(58) Field of Classification Search
CPC .... H03M 1/802; H03M 1/785; H03M 1/0624; H03M 1/68; H03M 1/747
USPC ......................................... 341/144, 145, 150
See application file for complete search history.

(56) References Cited

U.S. PATENT DOCUMENTS 9,806,729 B1 * 10/2017 Razzaghi ............ H03M 1/0612
11,196,440 B1 * 12/2021 Wang .................. H03M 1/0673

* cited by examiner

*Primary Examiner* — Khai M Nguyen
(74) *Attorney, Agent, or Firm* — Patterson + Sheridan, LLP

(57) ABSTRACT

A digital-to analog converter (DAC) includes an unary cell comprising unary slices, the unary slices are coupled in parallel, an intermediate significant bit (ISB) cell comprising ISB slices, the ISB slices are coupled in parallel, and a least significant bit (LSB) cell comprising LSB slices, the LSB slices are coupled in parallel, the unary cell, the ISB cell and the LSB cell each being coupled to each other, each of the unary slices comprising a set of cross-coupled capacitive elements including first capacitive elements having a first end coupled to a node positioned between a first pair of transistors and a second end coupled to a node positioned between a second pair of transistors, and second capacitive elements having a first end coupled to a node positioned between a third pair of transistors and a second end coupled to a node positioned between a fourth pair of transistors.

20 Claims, 4 Drawing Sheets

CROSS-COUPLED CAPACITIVE ELEMENTS IN HIGHSPEED DAC

TECHNICAL FIELD

Examples of the present disclosure generally relate to a segmented digital-to-analog converter (DAC).

BACKGROUND

In various electronic systems, information may be converted between digital and analog signal formats. For example, a digitally-encoded data stream may be transmitted as an analog signal and converted to an analog format by a digital-to-analog converter (DAC). DACs may be used in a variety of applications. DACs are commonly used in music players for converting digital data streams into audio signals, along with televisions and mobile phones to convert digital data streams into analog video signals.

SUMMARY

In one or more examples, a digital-to analog converter (DAC) includes an unary cell comprising unary slices, each of the unary slices coupled to one another in parallel, an intermediate significant bit (ISB) cell comprising ISB slices, each of the ISB slices coupled to one another in parallel, and a least significant bit (LSB) cell comprising LSB slices, each of the LSB slices coupled to one another in parallel, the unary cell, the ISB cell and the LSB cell each being coupled to each other, each of the unary slices comprising a set of cross-coupled capacitive elements. The set of cross-coupled capacitive elements includes first capacitive elements having a first end coupled to a node positioned between a first pair of transistors and a second end coupled to a node positioned between a second pair of transistors, and second capacitive elements having a first end coupled to a node positioned between a third pair of transistors and a second end coupled to a node positioned between a fourth pair of transistors.

In one or more examples, a digital-to-analog converter (DAC) includes an unary cell comprising unary slices, each of the unary slices coupled to one another in parallel, an intermediate significant bit (ISB) cell comprising ISB slices, each of the ISB slices coupled to one another in parallel, and a least significant bit (LSB) cell comprising LSB slices, each of the LSB slices coupled to one another in parallel, the unary cell, the ISB cell and the LSB cell each being coupled to each other, each of the unary slices comprising a set of cross-coupled capacitive elements configured to a delay an output current of the unary slices so that a timing of the output current of the unary slices, an output current of the ISB slices, and an output current of the LSB slices are aligned.

In one or more examples, a digital-to-analog converter (DAC) includes an unary cell comprising unary slices, each of the unary slices coupled to one another in parallel, an intermediate significant bit (ISB) cell comprising ISB slices, each of the ISB slices coupled to one another in parallel; and a least significant bit (LSB) cell comprising LSB slices, each of the LSB slices coupled to one another in parallel, the unary cell, the ISB cell, and the LSB cell each being coupled to one another, each of the ISB slices and each of the LSB slices are scaled down versions of the unary slices, and each of the unary slices comprising a set of cross-coupled capacitive elements configured to a delay an output current of the unary slices so that a timing of the output current of the unary slices, an output current of the ISB slices, and an output current of the LSB slices are aligned.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Examples described herein generally relate to devices and methods for a high speed digital-to-analog converter (DAC) architecture. High speed, high resolution DACs can be segmented into thermometer (T), intermediate (I), and binary (B) partitions. The T-bits (most significant bits) are decoded using a unary cell including unary slices. The I-bits, also known as the intermediate significant bits (ISBs) are decoded using an ISB cell including ISB slices. The B-bits, also known as the least significant bits (LSBs), are decoded using an LSB cell including LSB slices. In a high speed current-steering DAC each of the cells may include a different quantity of slices, so long as the DAC is segmented.

In a current steering-DAC, the output currents of ISB slices and LSB slices are expected to be exact scaled copies of the output currents of the unary slices. A large segmentation ratio, in which the quantity of unary cells is much greater than the ISB slices plus the LSB slices, assists in achieving a better signal to noise ratio (SNR) but requires a larger chip area and power consumption. However, a lower segmentation ratio may cause misalignment between the amplitudes and timing between the unary slices and the ISB slices. The ISB slices and LSB slices are scaled versions of the unary slices. However, the parasitic capacitances between the unary slices, and the ISB and LSB slices are not properly scaled, thus causing timing misalignments between the unary and ISB slices.

Embodiments herein, relate to a segmented DAC with a lower segmentation ratio with each segment having a matching output currents that are timing and amplitude aligned.

Figure 1:
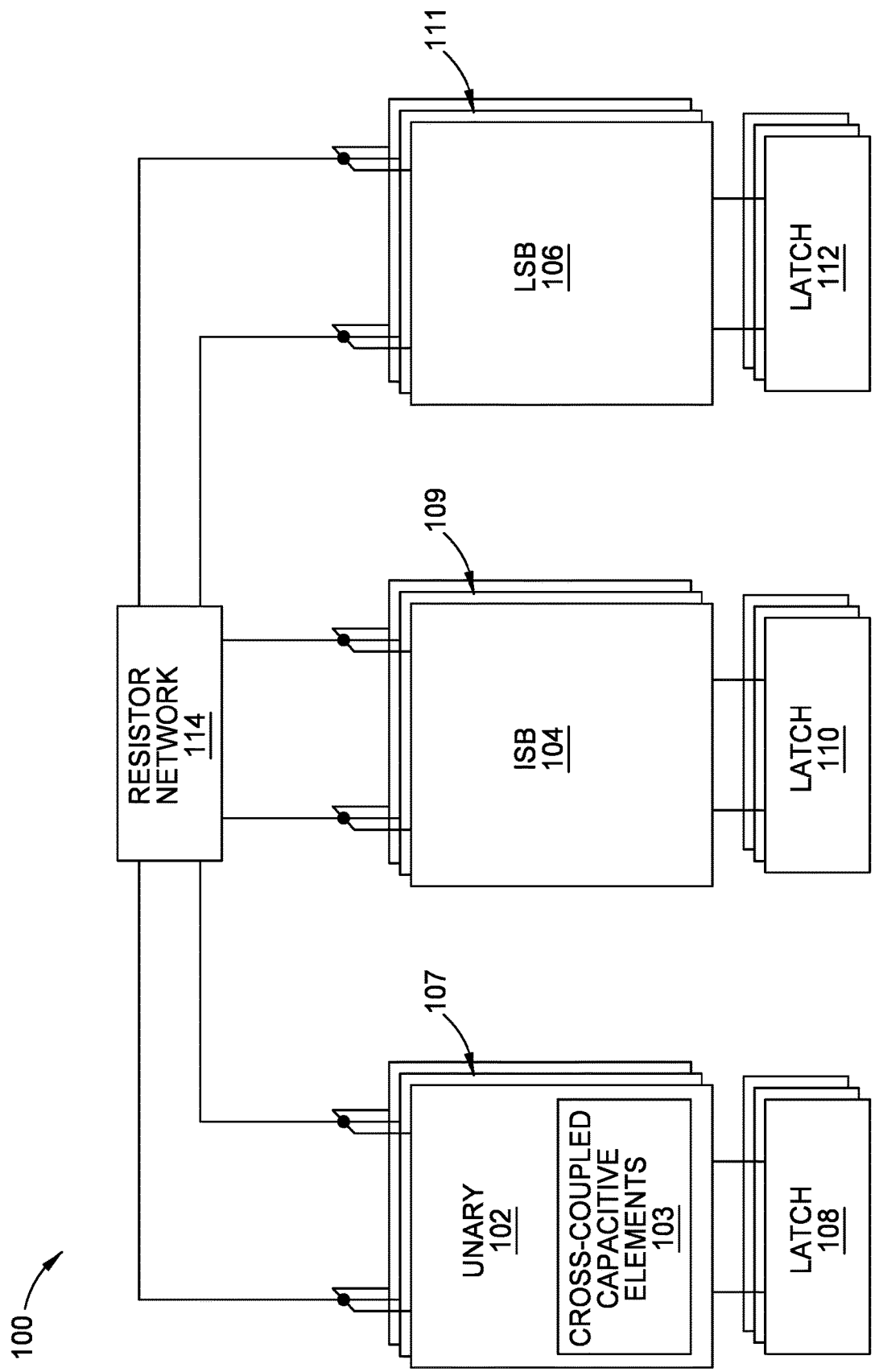
FIG. 1 illustrates a digital-to-analog converter (DAC) according to one or more examples.

FIG. 1 illustrates a digital-to-analog converter (DAC) 100 according to one or more examples. In one example, the DAC 100 is a high-speed, high-resolution current-steering DAC. In one example the DAC 100 is included in an integrated circuit (IC) device. The DAC 100 receives a digital input signal and outputs an analog signal. The DAC 100 is segmented into a unary cell 102, an ISB cell 104, and an LSB cell 106. The unary cell 102 includes unary slices 107, the ISB cell 104 includes ISB slices 109, and the LSB cell 106 includes LSB slices 111. The quantities of unary slices 107. ISB slices 109, and LSB slices 111 may be the same or different. For example, the quantities of each of the slices may range from 1 to 128. The slices of each of the cells are connected to one another in parallel. Each of the cells has differential outputs coupled to a resistor network 114. Each of the cells has differential inputs that are coupled to a latch. Each of the latches generates gate control signals for the slices of each of the cells. In this depicted example, the latches include multiple slices of latches. The unary slices 107 are coupled to latch 108. The ISB slices 109 are coupled to latch 110. The LSB slices 111 are coupled to latch 112.

As described above, the ISB slices 109 and the LSB slices 111 are scaled-down versions of the unary slices 107. For example, the output current of the ISB slices 109 is a fraction of the output current of the unary slices 107. However the ISB slices 109 and the LSB slices 111 are never perfectly impedance scaled copies of the unary slices 107 because the parasitic impedances between the unary slices 107 and the ISB slices 109 and LSB slices 111 do not scale accurately. This results in a poor timing alignment between the output currents of the unary slices 107, and the ISB slices 109 and the LSB slices 111. This timing misalignment results in higher order harmonics in the DAC 100 output spectrum. The high order harmonics manifest as output noise. These higher order harmonics behave similarly to noise in the output spectrum. The higher order harmonics degrade the noise spectral density (NSD) spurious-free dynamic range (SFDR) of the DAC 100. Stated differently, imperfect impedance scaling occurs because it does not account for the different parasitic capacitances between the different types of slices. For example, this slows down the output current of the ISB slices 109. The ISB slices 109 compared to the unary slices 107 have a higher delay and lower peaking than the unary slices 107, which causes overshoots when trying to align the currents using impedance scaling.

Advantageously, the unary slices 107 each include cross-coupled capacitive elements 103. The cross-coupled capacitive elements 103 add an additional delay to the output current of the unary slices 107, and thus, match the additional delay in the ISB slices 109 and the LSB slices 111, thus aligning each of their respective output currents and improving the NSD and SFDR of the DAC 100.

Figure 2:
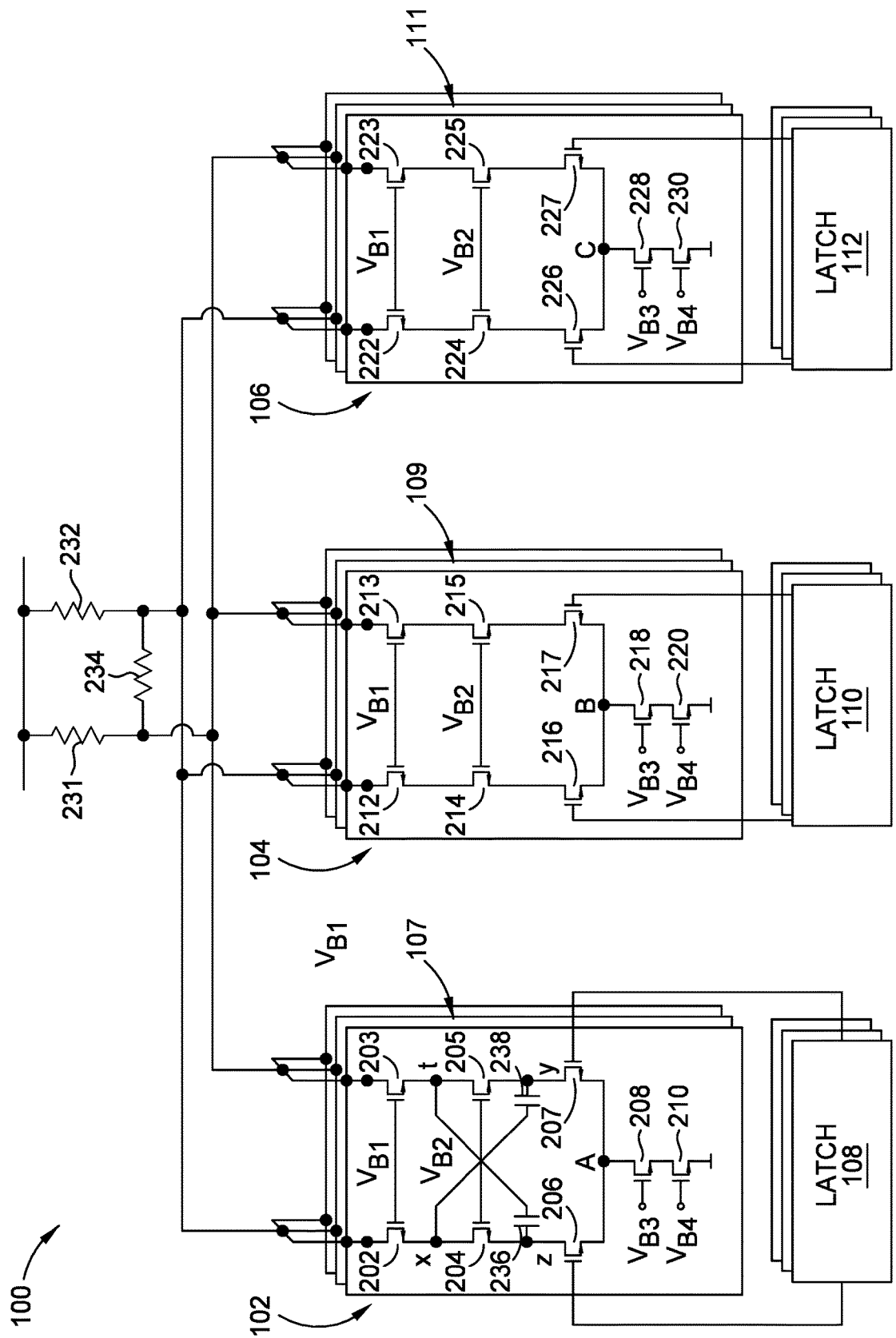
FIG. 2 is a more detailed schematic of the schematic of FIG. 1 according to one or more examples.

FIG. 2 is a more detailed schematic of the schematic of FIG. 1 according to one or more examples.

In this depicted example, the DAC 100 includes the unary cell 102, the ISB cell 104, and the LSB cell 106. Each of the cells includes a quantity of slices. For example, the unary cell 102 includes the unary slices 107, the ISB cell 104 includes the ISB slices 109, and the LSB cell 106 includes the LSB slices 111. The DAC 100 may be segmented in any manner. Stated differently the quantity of slices in each cell is not limited by this application. The quantity of the unary slices 107, the quantity of the ISB slices 109, and the quantity of the LSB slices 111 can be the same or different. In some embodiments each of the cells includes between 1 and 128 slices connected in parallel. Each of the cells are coupled to a corresponding latch that generates gate control signals for each of the cells. In this depicted example, the latches include multiple slices of latches. Each slice of each latch is coupled to a slice of a corresponding cell. The latch 108 includes slices of latches that provide gate control signals to the unary slices 107. The latch 110 includes slices of latches that provide gate control signals to the ISB slices 109. The latch 112 includes slices of latches that provide gate control signals to the LSB slices 111. In some examples, the DAC 100 includes a decoder (not shown) that receives a digital signal and converts it to binary signals.

In this example, each of the slices includes four pairs of switches/transistors. The first pair of switches/transistors of each of the unary slices 107 include transistor 206 and transistor 207. The first pair of switches/transistors of each of the ISB slices 109 include transistor 216 and transistor 217. The first pair of switches/transistors of each of the LSB slices 111 include transistor 226 and transistor 227. In one example, the first pairs of switches/transistors are thin oxide current steering switches. In another example, the first pairs of switches/transistors are metal oxide semiconductor field effect transistors (MOSFETs), bipolar junction transistors (BJTs), or the like. In the illustrated example, the first pairs of switches/transistors are N-type MOSFETs. As described above, transistors 216-217 and 226-227 are scaled down versions of transistors 206-207. Transistors 216-217 and 226-227 are scaled down by a gain factor of N. Stated differently, the gain factor of transistors 216-217 and 226-227 with respect to transistors 206-207 is 1/N.

The first pair of switches/transistors in each slice receive a differential output from a latch of their respective gates. For example, transistor 206 and transistor 207 each receive an output from latch 108. Transistor 216 and transistor 217 each receive an output from latch 110. Transistor 226 and transistor 227 each receive an output from latch 112. The inputs received at the gates of each of the first pairs of transistors are compliments of one another. The sources of each of the first pairs of switches/transistors are coupled to a node. For example, the sources of transistor 206 and transistor 207 are coupled to node A. The sources of transistor 216 and transistor 217 are coupled to node B. The sources of transistor 226 and transistor 227 are coupled to node C.

Each slice also includes a second pair of switches/transistors coupled between the node coupled to the sources of the first pair of switches/transistors and a reference voltage (such as ground). The second pair of switches/transistors act as a current source element. The second pair of switches/transistors of each of the unary slices 107 include transistor 208 and transistor 210. The second pair of switches/transistors of each of the ISB slices 109 include transistor 218 and transistor 220. The second pair of switches/transistors of each of the LSB slices 111 include transistor 228 and transistor 230.

In one example, the second pairs of switches/transistors are MOSFETs, BJTs, or the like. In the illustrated example, the second pairs of switches/transistors are N-type MOSFETs. As described above, transistors 218, 220, 228, and 230 are scaled down versions of transistors 208 and 210 by a factor of N. The second pair of switches/transistors receive an input voltage at their respective gates. For example, transistors 208, 218, and 228 receive voltage VB3. In one example, voltage VB3 is provided by a corresponding voltage that uses current biasing into a diode connected transistor. In other examples, other potential voltage sources can be used. In one example, Voltage VB3 is 0.6V. In other examples, VB3 may be any voltage that places transistors 208, 218, and 228 into saturation mode. Transistors 210, 220, and 230 receive voltage VB4. In one example, voltage VB4 is provided by a corresponding voltage that uses current biasing into a diode connected transistor. In other examples, other potential voltage sources can be used. In one example, Voltage VB4 is 0.4V. In other examples. VB4 may be any voltage to places transistors 210, 220, and 230 into saturation mode.

Each slice also includes a third pair of switches/transistors. In one example, the third pairs of switches/transistors are thin oxide output cascodes implemented using core devices. In another example, the third pairs of switches are MOSFETS, BJTs, or the like. In the illustrated example, the third pairs of switches/transistors are N-type MOSFETs. The third pair of switches/transistors of each of the unary slices 107 include transistor 204 and transistor 205. The third pair of switches/transistors of each of the ISB slices 109 include transistor 214 and transistor 215. The third pair of switches/transistors of each of the LSB slices 111 include transistor 224 and transistor 225. As described above, transistors 214-215 and 224-225 are scaled down versions of transistors 204-205. Transistors 214-215 and 224-225 are scaled down by a gain factor of N. The sources of each of the third pairs of switches/transistors are coupled to the drains of the first pair of switches/transistors. The inputs of the gates of each the third pairs of switches/transistors are coupled to each other. The voltage between the gates of the third pair of switches/transistors is VB2. In one example, voltage VB2 is provided by a corresponding voltage that uses current biasing into a diode connected transistor. In other examples, other potential voltage sources can be used. In one example, Voltage VB2 is 1.2 V. In other examples, VB2 may be any voltage that places transistors 204-205, 214-215, and 224-225 into saturation mode Each of the slices also includes a fourth pair of switches/transistors. In one example, the fourth pairs of switches/transistors are thick oxide upper cascodes implemented using I/O transistors. In another example, the fourth pairs of switches are MOSFETs, BJTs, or the like. In the illustrated example the fourth pairs of switches/transistors are N-type MOSFETs. The fourth pair of switches/transistors of each of the unary slices 107 include transistor 202 and transistor 203. The fourth pair of switches/transistors of each of the ISB slices 109 include transistor 212 and transistor 213. The fourth pair of switches/transistors of each of the LSB slices 111 include transistor 222 and transistor 223. As described above, transistors 212-213 and 222-223 are scaled down versions of transistors 202-203. Transistors 212-213 and 222-223 are scaled down by a gain factor of N. The sources of each of the fourth pairs of switches/transistors are coupled to the drains of the third pair of switches/transistors. The gates of each of the fourth pairs of switches/transistors are coupled to each other. The voltage between the gates of the fourth pair of switches/transistors is VB1. In one example, voltage VB1 is provided by a corresponding voltage that uses current biasing into a diode connected transistor. In other examples, other potential voltage sources can be used. In one example, Voltage VB1 is 1.5 V. In other examples. VB1 may be any voltage that places transistors 202-203, 212-213, and 222-223 into saturation mode.

The drains of each of the fourth pairs of switches/transistors (e.g., the outputs of the slices) are coupled to a resistor network (resistor network 114). The resistor network includes a termination resistor 231, a termination resistor 232, and a load resistor 234. The termination resistor 231 and the termination resistor 232 are each coupled to the respective outputs of each of the slices. For example, the termination resistor 231 is coupled to the drains of transistor 202, transistor 212, and transistor 222. The termination resistor 232 is coupled to the drains of transistor 203, transistor 213, and transistor 223. The two control signals provided by the latches determine whether current flows to the termination resistor 231 (e.g., current is output on the left output of each cell at transistors 202, 212, and 222) or to the termination resistor 232 (e.g., current is output on the right output of each cell at transistors 203, 213, and 223). In one example, a load resistor 234 is coupled between termination resistor 231 and termination resistor 232.

As described above, to account for the additional delay in the ISB slices 109 and the LSB slices 111, the unary slices 107 include cross-coupled capacitive elements 103. The unary slices 107 include a capacitive element 236 and a capacitive element 238. The capacitive element 236 and the capacitive element 238 are any type of circuit element that imparts a capacitance such as a dual-plate capacitor. The capacitive element 236 is connected between a node x that is positioned between transistor 202 and transistor 204, and a node y that is positioned between transistor 205 and transistor 207. The capacitive element 238 is connected between a node t that is positioned between transistor 203 and transistor 203, and a node z that is positioned between transistor 204 and 206. The node x is positioned between the source of transistor 202 and the drain of transistor 204. The node y is positioned between the source of transistor 205 and the drain of transistor 207. The node t is positioned between the source of transistor 203 and the drain of transistor 205. The node z is positioned between the source of transistor 204 and the drain of transistor 206.

The capacitive element 236 and capacitive element 238 accumulate charge because the DC operating voltage at node x is greater than node y, and the operating DC voltage at node t is greater than node z. This adds an increased delay to the output of the unary slices 107 and thus, aligns the output current of each of the cells (segments). Furthermore, nodes x and t are differentially out of phase with nodes y and z, and thus, increases the effective capacitances due to the Miller effect. This results in an efficient compact process, voltage, and temperature (PVT) tracking structure.

Figure 3:
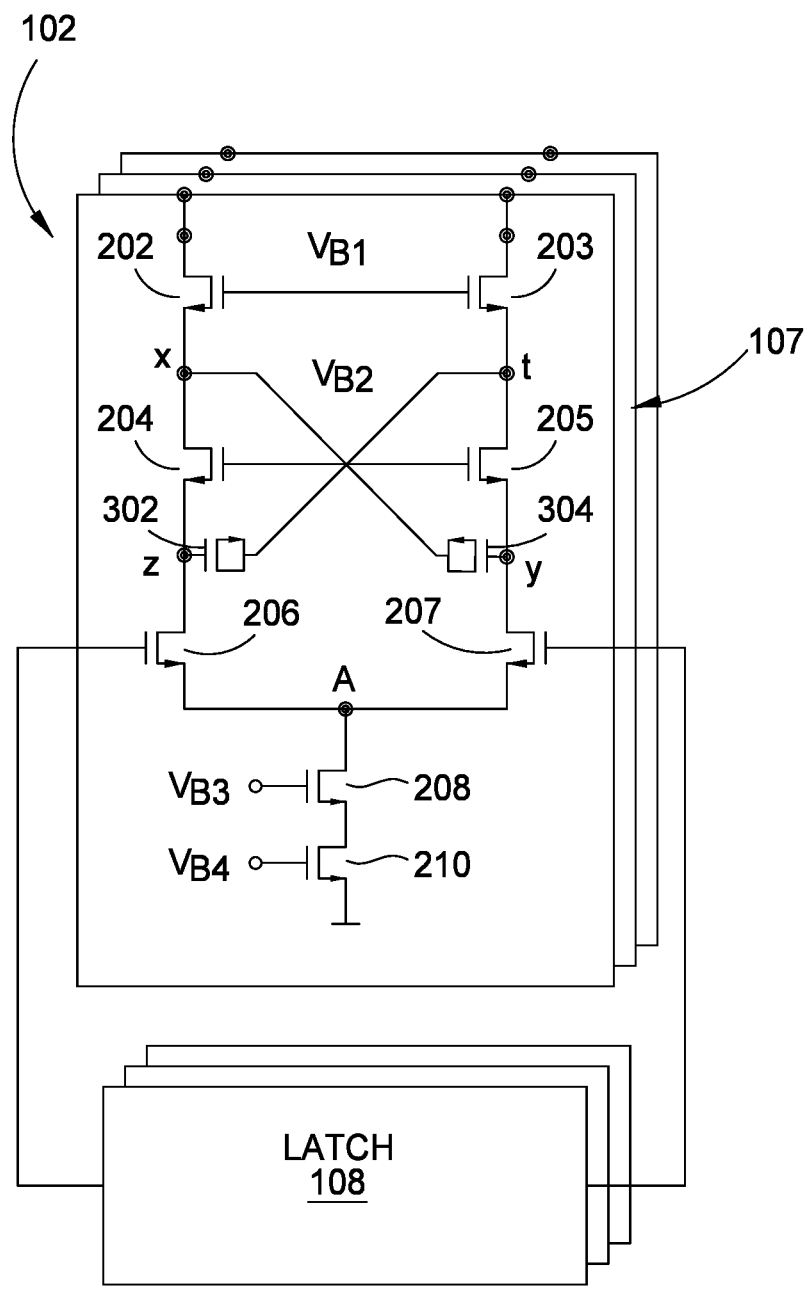
FIG. 3 illustrates a unary cell according to one or more examples.

FIG. 3 illustrates a unary cell 102 according to one or more examples. In one or more examples, the capacitive elements 236 and 238 are implemented as transistors 302 and 304, respectively. For example, the transistors 302 and 304 are metal oxide semiconductor field effect transistor (MOSFET) devices, such as thin oxide core NMOS devices. Advantageously, because nodes x and t have higher operating DC voltages than nodes y and z, the transistors 302 and 304 are in accumulation mode and create a delay in the output current of the unary slices 107. Additionally, for the same reasons explained above the effective capacitances of the unary slices 107 are increased due to the Miller effect.

Figure 4:
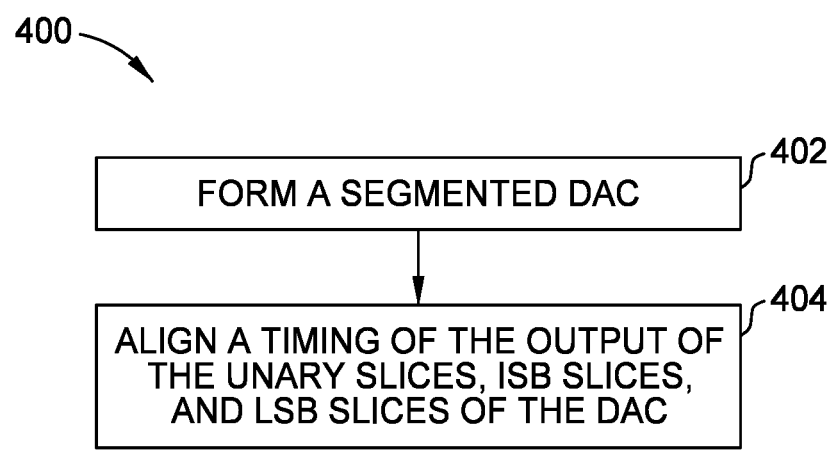
FIG. 4 Illustrates a method for aligning output currents of cells of a segmented DAC having a low segmentation ratio according to one or more examples.

FIG. 4 Illustrates a method 400 for aligning output currents of cells of a segmented DAC having a low segmentation ratio according to one or more examples. FIG. 4 is described with reference to FIGS. 1-3.

At step 402, a segmented DAC, such as DAC 100 is formed. As described above, the DAC 100 is segmented into the unary cell 102, the ISB cell 104, and the LSB cell 106.

At step 404, the output current of each cell of the DAC 100 is aligned by including cross-coupled capacitive elements 103 in the unary cell 102 of the DAC 100. Stated differently, the capacitive element 236 and the capacitive element 238 delay the output current of unary cell 102. This aligns the timing of the outputs of the unary slices 107, the ISB slices 109, and the LSB slices 111.

What is claimed is:
1. A digital-to-analog converter (DAC) comprising:
an unary cell comprising unary slices coupled to one another in parallel;
an intermediate significant bit (ISB) cell comprising ISB slices coupled to one another in parallel; and
a least significant bit (LSB) cell comprising LSB slices coupled to one another in parallel, the unary cell, the ISB cell, and the LSB cell each being coupled to each other, each of the unary slices comprising a set of cross-coupled capacitive elements, the set of cross-coupled capacitive elements comprising:

first capacitive elements having a first end coupled to a node positioned between a first pair of transistors and a second end coupled to a node positioned between a second pair of transistors; and second capacitive elements having a first end coupled to a node positioned between a third pair of transistors and a second end coupled to a node positioned between a fourth pair of transistors.

2. The DAC of claim 1, wherein the first pair of transistors and the fourth pair of transistors share a common transistor and the second pair of transistors and the third pair of transistors share a common transistor.

3. The DAC of claim 1, wherein the set of cross-coupled capacitive elements includes metal oxide semiconductor field effect transistor (MOSFET) devices.

4. The DAC of claim 1, wherein the ISB cell is scaled down from the unary cell by a factor of an integer N.

5. The DAC of claim 1, wherein the unary slices, the ISB slices, and the LSB slices are each coupled to a resistor network, the resistor network comprising a first termination resistor coupled to a first differential output of each of the unary slices, the ISB slices, and the LSB slices and a second termination resistor couple to a second differential output of each of the unary slices, the ISB slices, and the LSB slices.

6. The DAC of claim 1, further comprising:
a first latch coupled to each of the unary slices;
a second latch coupled to each of the ISB slices; and
a third latch coupled to each of the LSB slices.

7. The DAC of claim 1, wherein a quantity of the unary slices, a quantity of the ISB slices, and a quantity of the LSB slices are different.

8. An integrated circuit (IC) device comprising:
a digital-to-analog converter (DAC) comprising:
an unary cell comprising unary slices coupled to one another in parallel;
an intermediate significant bit (ISB) cell comprising ISB slices coupled to one another in parallel; and
a least significant bit (LSB) cell comprising LSB slices coupled to one another in parallel, the unary cell, the ISB cell and the LSB cell each being coupled to each other, each of the unary slices comprising a set of cross-coupled capacitive elements.

9. The IC device of claim 8, wherein the set of cross-coupled capacitive elements includes metal oxide semiconductor field effect transistor (MOSFET) devices.

10. The IC device of claim 8, wherein the ISB cell is scaled down from the unary cell by a factor of an integer N.

11. The IC device of claim 8, wherein the unary slices, the ISB slices, and the LSB slices are each coupled to a resistor network.

12. The IC device of claim 11, wherein the resistor network comprises a first termination resistor coupled to a first differential output of each of the unary slices, the ISB slices, and the LSB slices and a second termination resistor couple to a second differential output of each of the unary slices, the ISB slices, and the LSB slices.

13. The IC device of claim 8, further comprising:
a first latch coupled to each of the unary slices;
a second latch coupled to each of the ISB slices; and
a third latch coupled to each of the LSB slices.

14. The IC device of claim 8, wherein a quantity of the unary slices, a quantity of the ISB slices, and a quantity of the LSB slices are different.

15. A digital-to-analog converter (DAC) comprising:
an unary cell comprising unary slices coupled to one another in parallel;
an intermediate significant bit (ISB) cell comprising ISB slices coupled to one another in parallel; and
a least significant bit (LSB) cell comprising LSB slices coupled to one another in parallel, wherein the unary cell, the ISB cell, and the LSB cell are each coupled to one another, wherein the ISB slices and the LSB slices are scaled down versions of the unary slices, and wherein each of the unary slices comprises a set of cross-coupled capacitive elements configured to a delay an output current of the unary slices so that timings of the output current of the unary slices, an output current of the ISB slices, and an output current of the LSB slices are aligned.

16. The DAC of claim 15, wherein the set of cross-coupled capacitive elements includes metal oxide semiconductor field effect transistor (MOSFET) devices.

17. The DAC of claim 15, wherein the ISB slices and the LSB slices are scaled down from the unary slices by a factor of an integer N.

18. The DAC of claim 15, wherein the unary slices, the ISB slices, and the LSB slices are each coupled to a resistor network.

19. The DAC of claim 15, further comprising:
a first latch coupled to each of the unary slices;
a second latch coupled to each of the ISB slices; and
a third latch coupled to each of the LSB slices.

20. The DAC of claim 15, wherein a quantity of the unary slices, a quantity of the ISB slices, and a quantity of the LSB slices are different.

* * * * *